United States Patent
Cheng

(10) Patent No.: US 10,426,038 B2
(45) Date of Patent: Sep. 24, 2019

(54) MANUFACTURING METHOD OF CIRCUIT BOARD

(71) Applicant: Unimicron Technology Corp., Taoyuan (TW)

(72) Inventor: Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 220 days.

(21) Appl. No.: 15/256,759

(22) Filed: Sep. 6, 2016

(65) Prior Publication Data

US 2017/0273190 A1  Sep. 21, 2017

Related U.S. Application Data

(60) Provisional application No. 62/309,930, filed on Mar. 17, 2016.

(51) Int. Cl.
*H05K 3/06* (2006.01)
*G03F 7/16* (2006.01)
(Continued)

(52) U.S. Cl.
CPC .......... *H05K 3/064* (2013.01); *G03F 7/0002* (2013.01); *G03F 7/162* (2013.01); *G03F 7/20* (2013.01);
(Continued)

(58) Field of Classification Search
CPC ...... H05K 3/064; H05K 1/115; H05K 3/0023; H05K 3/06; H05K 3/108; H05K 3/465;
(Continued)

(56) References Cited

U.S. PATENT DOCUMENTS 7,955,545 B2 * 6/2011 Lee .............. B29C 59/022
 264/293
8,409,488 B2 * 4/2013 Massimo .......... B29C 33/02
 264/479
(Continued)

FOREIGN PATENT DOCUMENTS

JP 2000127175 5/2000
JP 2008062486 3/2008
(Continued)

OTHER PUBLICATIONS

Title: "Effect of nanoimprint on the elastic modulus of PMMA: Comparison between standard and ultrafast thermal NIL" Authors: "Pianigiani M Kirchner R Sovernigo E Pozzato A Tormen M et. al." Reference: Microelectronic Engineering 2016 vol. 155 pp. 85-91.*
(Continued)

*Primary Examiner* — Carl J Arbes
(74) *Attorney, Agent, or Firm* — JCIPRNET

(57) ABSTRACT

A manufacturing method of a circuit board and a stamp are provided. The method includes: forming a circuit pattern and a dielectric layer on a dielectric substrate; forming a conductive via in the dielectric layer; forming a thermal-sensitive adhesive layer on the dielectric layer; forming a photoresist material layer on the thermal-sensitive adhesive layer; imprinting the photoresist material layer using a stamp, wherein a first conductive layer is disposed on the surface of the pressing side of the stamp, a second conductive layer is disposed on the surface of the other portions; applying a current to the stamp; removing the stamp and the photoresist material layer and the thermal-sensitive adhesive layer below the pressing side to form a patterned photoresist layer and thermal-sensitive adhesive layer; forming a patterned metal layer on the region exposed by the patterned
(Continued)

photoresist layer; removing the patterned photoresist layer and thermal-sensitive adhesive layer.

13 Claims, 4 Drawing Sheets

(51) Int. Cl.
    *G03F 7/20*     (2006.01)
    *H05K 1/11*     (2006.01)
    *H05K 3/00*     (2006.01)
    *H05K 3/10*     (2006.01)
    *H05K 3/46*     (2006.01)
    *G03F 7/00*     (2006.01)

(52) U.S. Cl.
    CPC ........... *H05K 1/115* (2013.01); *H05K 3/0023* (2013.01); *H05K 3/06* (2013.01); *H05K 3/108* (2013.01); *H05K 3/465* (2013.01); *H05K 3/4644* (2013.01); *H05K 2201/091* (2013.01); *H05K 2203/0108* (2013.01); *H05K 2203/0369* (2013.01); *H05K 2203/0502* (2013.01); *H05K 2203/0548* (2013.01); *H05K 2203/0562* (2013.01); *Y10T 29/49124* (2015.01); *Y10T 29/49155* (2015.01)

(58) Field of Classification Search
    CPC ...... H05K 3/4644–3/4682; H05K 1/00–1/189; G03F 7/0002; G03F 7/162; G03F 7/20; H01L 21/76817

USPC ................ 257/698, 680, E21.705, 668, 678; 174/250, 257, 258, 260; 216/19; 361/760; 438/613, 16, 109

See application file for complete search history.

(56) References Cited

U.S. PATENT DOCUMENTS

| | | | |
|---|---|---|---|
| 8,418,355 B2* | 4/2013 | Kim | H05K 3/20 101/170 |
| 8,940,117 B2* | 1/2015 | Slafer | B82Y 10/00 156/219 |
| 9,018,096 B2* | 4/2015 | Price | H01L 21/7688 257/E21.586 |
| 2009/0223046 A1* | 9/2009 | Murayama | H01L 21/4857 29/847 |
| 2012/0295435 A1 | 11/2012 | Yoneda | |

FOREIGN PATENT DOCUMENTS

| | | | |
|---|---|---|---|
| JP | 2008062486 A | * | 3/2008 |
| TW | 200848922 | | 12/2008 |
| TW | 201530374 | | 8/2015 |

OTHER PUBLICATIONS

JP2008062486A (Year: 2008).*
"Office Action of Taiwan Counterpart Application", dated May 9, 2017, p. 1-p. 4, in which the listed references were cited.

* cited by examiner

MANUFACTURING METHOD OF CIRCUIT BOARD

CROSS-REFERENCE TO RELATED APPLICATION

This application claims the priority benefit of U.S. provisional application Ser. No. 62/309,930, filed on Mar. 17, 2016. The entirety of the above-mentioned patent application is hereby incorporated by reference herein and made a part of this specification.

BACKGROUND OF THE INVENTION

Field of the Invention

The invention relates to a manufacturing method of a circuit board and a stamp, and more particularly, to a manufacturing method of a circuit board stabilizing a patterned photoresist layer using a thermal-sensitive adhesive layer and a stamp used in the method.

Description of Related Art

Nano-imprint lithography (NIL) is a technique for manufacturing fine circuits and is extensively applied in the LED and OLED industries. NIL includes pressing a mold prototype having a pattern (generally referred to as mold, stamp, or template) on a photoresist material to mechanically deform the photoresist material so as to precisely transfer a fine pattern. Therefore, once the manufacture of the mold is complete, a fine structure such as a nano structure can be repeatedly molded in a simple manner, and manufacturing costs and the production of harmful waste in the manufacture can be effectively reduced. As a result, NIL has been expected to be applied in various areas in recent years.

However, after NIL transfers a pattern to a photoresist material using a stamp, comprehensive exposure needs to be performed, and therefore a patterned photoresist layer to be formed and unnecessary residual photoresist material are both exposed to light. As a result, the residual photoresist layer cannot be removed by a developing solution in a simple manner. Therefore, unnecessary residual photoresist material needs to be removed using inductively-coupled plasma (ICP) or reactive ion etching (RIE), such that the photoresist pattern to be formed is readily damaged and the process yield is poor. Moreover, if the thickness of unnecessary residual photoresist material is too great, then the residual photoresist material may not be completely removed using ICP or RIE.

Moreover, since the size of the fine circuit continues to be reduced, the resulting patterned photoresist layer often has the issue of falling or collapsing due to the small size, and therefore process yield is affected.

SUMMARY OF THE INVENTION

The invention provides a manufacturing method of a circuit board in which a patterned photoresist layer is fixed using a thermal-sensitive adhesive layer.

The invention provides a stamp that can be used in the manufacturing method of a circuit board.

The manufacturing method of a circuit board of the invention includes the following steps. A dielectric substrate is provided, and a circuit pattern, a dielectric layer covering the circuit pattern, and a conductive via located in the dielectric layer and connected to the circuit pattern are disposed on the dielectric substrate. A thermal-sensitive adhesive layer is formed on the dielectric layer. A photoresist material layer is formed on the thermal-sensitive adhesive layer. Imprinting is performed on the photoresist material layer via the stamp, wherein a first conductive layer is disposed on the surface of the pressing side of the stamp facing the circuit pattern, a second conductive layer is disposed on the surface of other portions of the stamp, and the resistance of the first conductive layer is greater than the resistance of the second conductive layer. Current is applied to the stamp. The stamp and the photoresist material layer and the thermal-sensitive adhesive layer below the pressing side are removed to form a patterned photoresist layer and a patterned thermal-sensitive adhesive layer. A patterned metal layer is formed on a region exposed by the patterned photoresist layer. The patterned photoresist layer is removed. The patterned thermal-sensitive adhesive layer is removed.

In an embodiment of the manufacturing method of a circuit board of the invention, the photoresist material layer is, for instance, a negative photoresist material layer, and the method further includes, after current is applied to the stamp and before the photoresist material and the thermal-sensitive adhesive layer below the pressing side are removed, performing exposure on the photoresist material layer.

In an embodiment of the manufacturing method of a circuit board of the invention, the photoresist material layer is, for instance, a positive photoresist material layer, and the photoresist material and the thermal-sensitive adhesive layer below the pressing side are directly removed after current is applied to the stamp.

In an embodiment of the manufacturing method of a circuit board of the invention, after current is applied to the stamp, the temperature of the first conductive layer is, for instance, higher than 100° C. so as to reduce the adhesion of the thermal-sensitive adhesive layer below the pressing side.

In an embodiment of the manufacturing method of a circuit board of the invention, the method further includes, after the conductive via is formed and before the thermal-sensitive adhesive layer is formed, forming a conductive seed layer on the dielectric layer and the conductive via, and the method further includes, after the patterned thermal-sensitive adhesive layer is removed, removing the conductive seed layer below the patterned thermal-sensitive adhesive layer.

In an embodiment of the manufacturing method of a circuit board of the invention, the method further includes, before the patterned thermal-sensitive adhesive layer is removed, performing UV irradiation, laser irradiation, or infrared heating on the patterned thermal-sensitive adhesive layer.

In an embodiment of the manufacturing method of a circuit board of the invention, the patterned thermal-sensitive adhesive layer is, for instance, removed by applying a mechanical force.

The stamp of the invention is used to perform imprinting on the photoresist material layer, and the stamp includes a body, a first conductive layer, and a second conductive layer. The body has a pressing side facing the photoresist material layer. The first conductive layer is disposed on the surface of the pressing side. The second conductive layer is disposed on the surface of a portion of the body other than the pressing side. The resistance of the first conductive layer is greater than the resistance of the second conductive layer.

In an embodiment of the stamp of the invention, the material of the body is, for instance, a polymer material.

In an embodiment of the invention, when the current passes through the first conductive layer and the second conductive layer, the temperature of the first conductive layer is higher than the temperature of the second conductive layer.

Based on the above, in the invention, the thermal-sensitive adhesive layer below the pressing side of the stamp is heated to reduce adhesion by applying current to the stamp to heat the stamp. Therefore, when the stamp is removed, the unnecessary thermal-sensitive adhesive layer can be removed at the same time and an additional removing process does not need to be performed. Moreover, in the invention, the patterned photoresist layer is formed on a film layer below in a stable manner via the thermal-sensitive adhesive layer, and therefore the patterned photoresist layer can be effectively prevented from falling or collapsing. Therefore, the adhesion of the photoresist material is less influential in the selection of a photoresist material, such that the selection of the photoresist material is more flexible.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
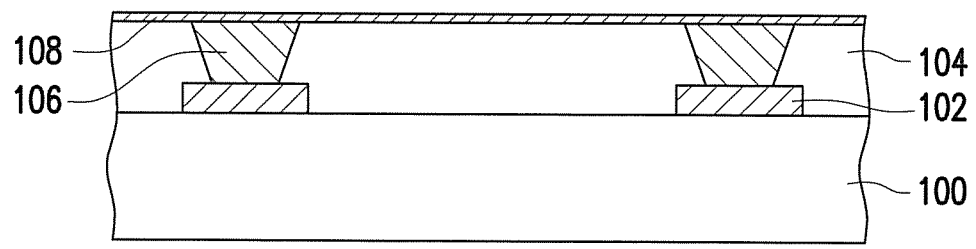
FIG. 1A to FIG. 1I are cross-sectional schematics of the manufacturing process of a circuit board shown according to an embodiment of the invention.

FIG. 1A to FIG. 1I are cross-sectional schematics of the manufacturing process of a circuit board shown according to an embodiment of the invention. First, referring to FIG. 1A, a circuit pattern 102 is formed on a dielectric substrate 100. The forming method of the circuit pattern 102 includes, for instance, forming a conductive material layer on the dielectric substrate 100 via a lamination method and patterning the conductive material layer. The material of the dielectric substrate 100 is, for instance, epoxy resin, glass fiber cloth, or ceramic. The conductive material layer is, for instance, a copper layer. Next, a dielectric layer 104 is formed on the dielectric substrate 100. The dielectric layer 104 covers the circuit pattern 102 on the dielectric substrate 100. The material of the dielectric layer 104 is, for instance, epoxy resin. The dielectric layer 104 is, for instance, formed on the dielectric substrate 100 via a lamination method. Next, a via exposing a portion of the circuit pattern 102 is formed in the dielectric layer 104. The forming method of the via includes, for instance, performing laser drilling or mechanical drilling. Then, a conductive layer 106 is formed in the via. The material of the conductive layer 106 is, for instance, copper, and the forming method thereof includes, for instance, performing an electroplating process. Alternatively, the material of the conductive layer 106 is, for instance, conductive gel, and the forming method thereof includes, for instance, performing a stuffing process. The conductive layer 106 is used as a conductive via for connecting the circuit pattern 102. Then, a conductive seed layer 108 is formed on the dielectric layer 104 and the conductive layer 106. The material of the conductive seed layer 108 is, for instance, copper.

Figure 1B:
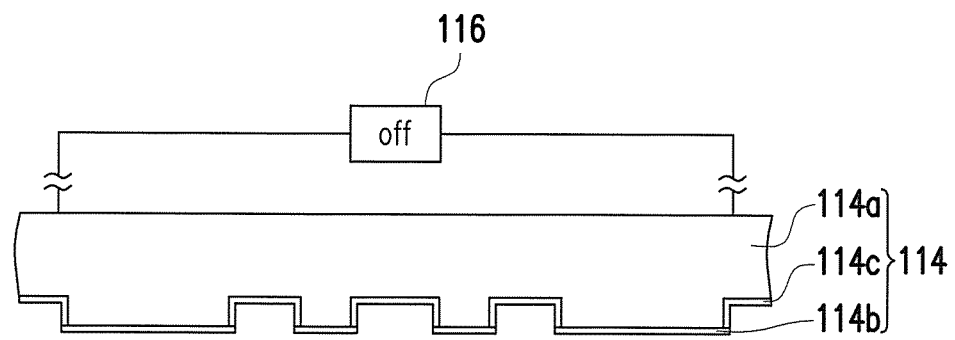
Figure 1B:
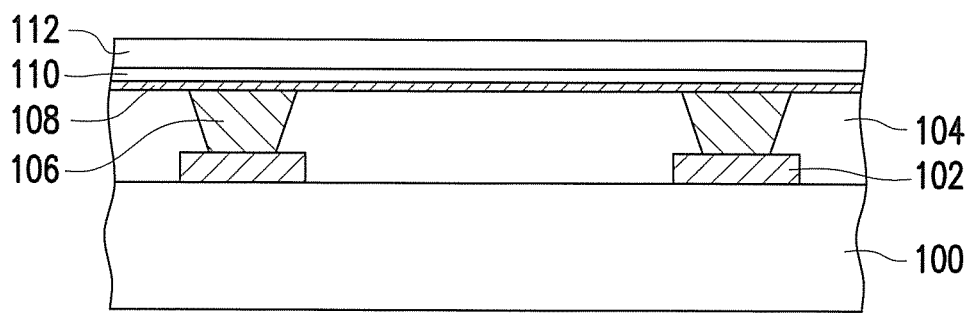

Then, referring to FIG. 1B, a thermal-sensitive adhesive layer 110 is formed on the conductive seed layer 108. When the thermal-sensitive adhesive layer 110 is heated to high temperature (such as greater than 100° C.) by UV irradiation, laser irradiation, or infrared heating, the adhesion of the thermal-sensitive adhesive layer 110 is significantly reduced (even lost) such that the thermal-sensitive adhesive layer 110 is readily removed. Then, a photoresist material layer 112 is formed on the thermal-sensitive adhesive layer 110. The forming method of the photoresist material layer 112 is, for instance, a spin coating method. Alternatively, the photoresist material layer 112 can be formed on the thermal-sensitive adhesive layer 110 via a lamination method. In the present embodiment, the photoresist material layer 112 is, for instance, a negative photoresist material layer, and a portion thereof irradiated by UV light in a subsequent exposure process is solidified.

Moreover, a stamp 114 is provided to perform imprinting on the photoresist material layer 112. The stamp 114 has a pattern corresponding to the circuit pattern to be formed on the dielectric layer 104. When the stamp 114 is pressed on the photoresist material layer 112, mechanical deformation can occur to the photoresist material layer 112, such that a pattern is precisely transferred to the photoresist material layer 112. Moreover, the stamp 114 includes a body 114a and a conductive layer 114b and a conductive layer 114c disposed on the body 114a. Specifically, the body 114a has a circuit-forming intaglio pattern on a pressing side, the conductive layer 114b is disposed on the surface of the pressing side of the body 114a facing the circuit pattern 102, the conductive layer 114c is disposed on the surface of the other portions of the body 114a, and the resistance of the conductive layer 114b is greater than the resistance of the conductive layer 114c. In the present embodiment, the material of the conductive layers 114b and 114c is not limited as long as the resistance of the conductive layer 114b is greater than the resistance of the conductive layer 114c. Moreover, the conductive layers 114b and 114c are connected to an external power supply 116. When the external power supply 116 is turned on, current can pass through the conductive layers 114b and 114c and heating can be performed on the conductive layers 114b and 114c via the inherent resistance of the conductive layers 114b and 114c.

Figure 1C:
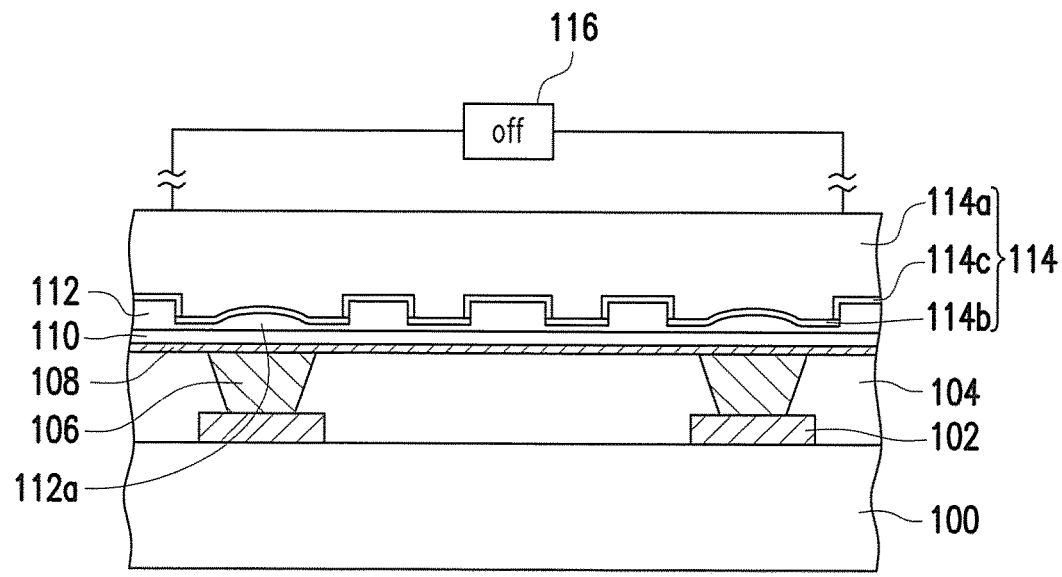

Next, referring to FIG. 1C, imprinting is performed on the photoresist material layer 112 using the stamp 114. When the stamp 114 is pressed on the photoresist material layer 112, the photoresist material layer 112 is deformed, such that the pattern of the stamp 114 can be precisely transferred to the photoresist material layer 112. When the imprinting is performed, a very thin and unavoidable photoresist residue 112a is generally formed between the stamp 114 and the thermal-sensitive adhesive layer 110. In particular, for the large contact area between the stamp 114 and the thermal-sensitive adhesive layer 110, the very thin and unavoidable photoresist residue 112a is largely concentrated in the center of the contact region, and the thickness distribution thereof shows a roughly Gaussian distribution from the periphery to the center. Since the stamp 114 is largely formed by a polymer material, as shown in FIG. 1C, the region of the stamp 114 in contact with the photoresist residue 112a is slightly deformed with the photoresist residue 112a.

Figure 1D:
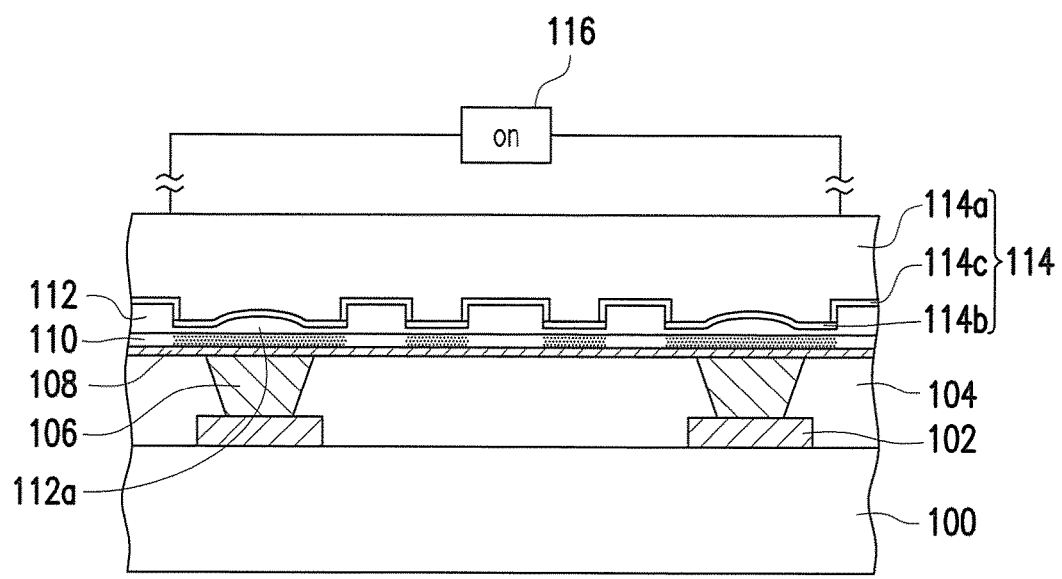

Next, as shown in FIG. 1D, the external power supply 116 is turned on to apply current to the stamp 114. After the external power supply 116 is turned on, current passes through the conductive layers 114b and 114c. At this point, current thermal effect is induced by the inherent resistance characteristics of the conductive layers 114b and 114c, such that the temperature of the conductive layers 114b and 114c is increased. Since the resistance of the conductive layer 114b is greater than the resistance of the conductive layer 114c, the temperature of the conductive layer 114b is higher than the temperature of the conductive layer 114c. As a result, heating can be indirectly performed on the thermal-sensitive adhesive layer 110 below the conductive layer 114b via the conductive layer 114b to reduce the adhesion of the thermal-sensitive adhesive layer 110 below the conductive layer 114b. In the present embodiment, the temperature of the conductive layer 114b is increased to greater than 100° C. via the regulation of current, so as to significantly reduce the adhesion of the thermal-sensitive adhesive layer 110 below the conductive layer 114b, and the adhesion of the thermal-sensitive adhesive layer 110 below the conductive layer 114b may even be lost, such that adhesion of the thermal-sensitive adhesive layer 110 below the conductive layer 114b to the conductive seed layer 108 is lost. Regarding the thermal-sensitive adhesive layer 110 not below the conductive layer 114b, since the temperature is not increased to the point at which significant adhesion is lost, adhesion to the conductive seed layer 108 is retained. At this point, the thermal-sensitive adhesive layer 110 on the conductive seed layer 108 is divided into a first portion heated by the conductive layer 114b and for which the adhesion is significantly reduced or lost and a second portion not heated by the conductive layer 114b and retaining the original adhesion.

Figure 1E:
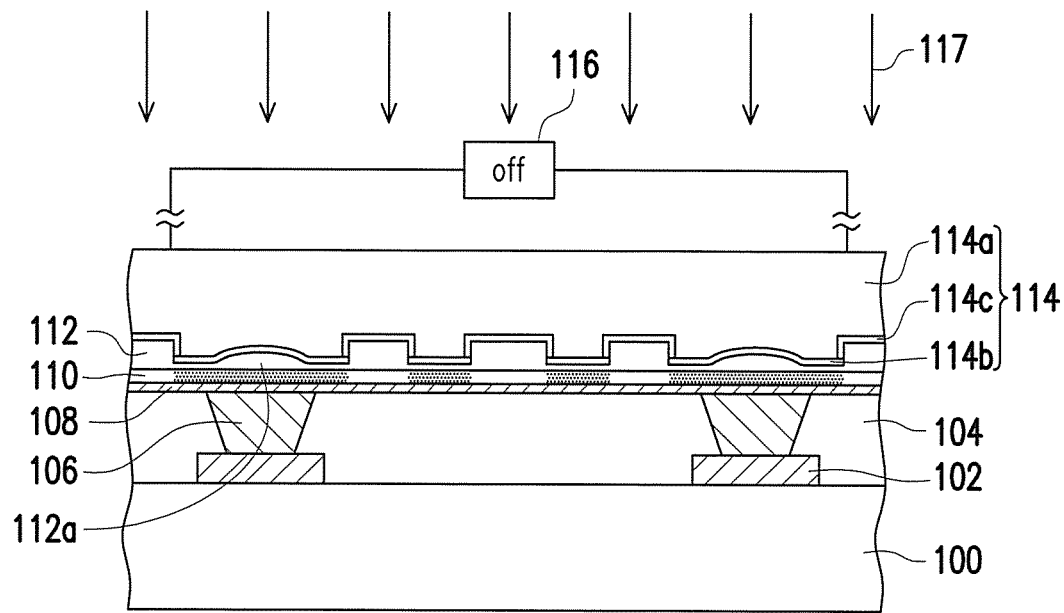

Next, referring to FIG. 1E, the external power supply 116 is turned off. Next, an exposure process is performed on the imprinted photoresist material layer 112 to solidify the photoresist material layer 112. In the present embodiment, comprehensive irradiation is performed on the imprinted photoresist material layer 112 using a UV light 117. When the UV light 117 passes through the body 114a and the conductive layers 114b and 114c and is irradiated on the photoresist material layer 112, a cross-linking reaction can occur in the photoresist material layer 112 such that the photoresist material layer 112 is solidified. Since the UV light 117 needs to pass through the body 114a and the conductive layers 114b and 114c, the materials of the body 114a and the conductive layers 114b and 114c need to be UV penetrable.

Figure 1F:
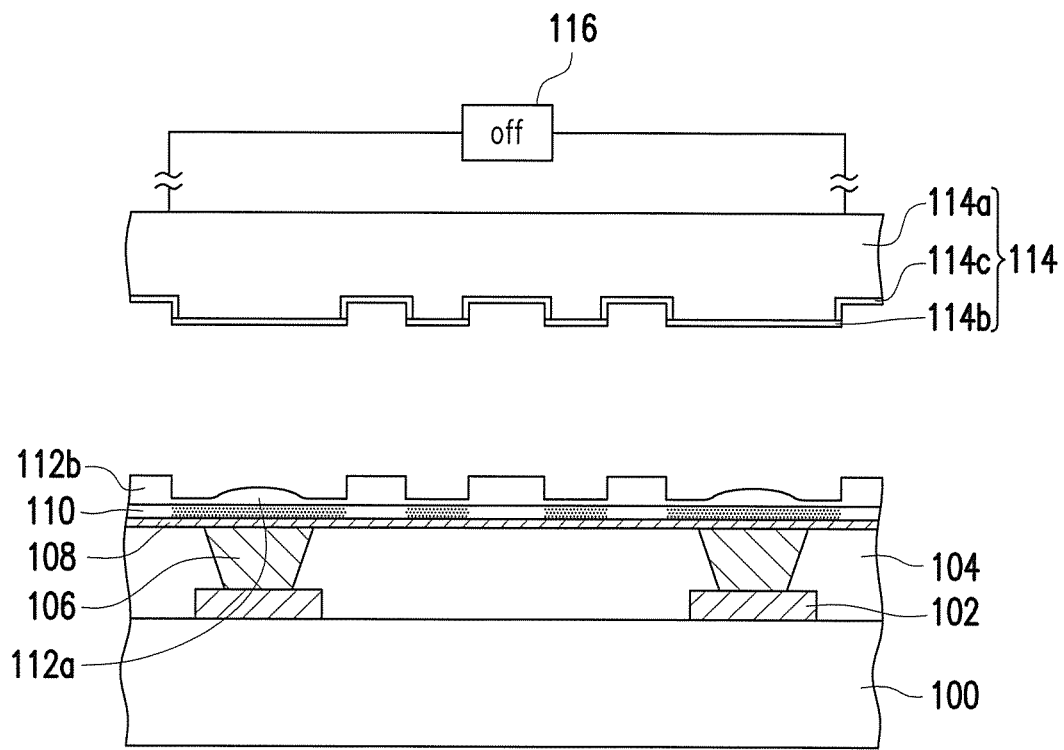

Next, referring to FIG. 1F, the stamp 114 is removed. At this point, the first portion for which the adhesion is significantly reduced or lost and the second portion retaining the original adhesion of the thermal-sensitive adhesive layer 110 are retained on the conductive seed layer 108.

Figure 1G:
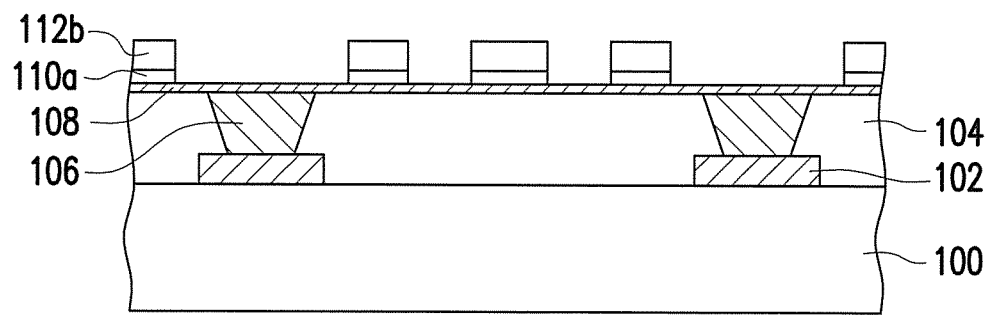

Next, referring to FIG. 1G, since the adhesion of the first portion of the thermal-sensitive adhesive layer 110 is significantly reduced or lost, the first portion can be directly removed, and the photoresist residue 112a located on the first portion when the first portion is removed is also removed. At this point, a patterned photoresist layer 112b and the second portion of the thermal-sensitive adhesive layer 110 not removed (i.e., a patterned thermal-sensitive adhesive layer 110a) are formed on the conductive seed layer 110, and the patterned photoresist layer 112b is firmly formed on the conductive seed layer 108 via the patterned thermal-sensitive adhesive layer 110a below the patterned photoresist layer 112b. As a result, even if the patterned photoresist layer 112b has high aspect ratio, the patterned photoresist layer 112b can still be located on the conductive seed layer 108 in a stable manner without falling or collapsing. In other words, in the present embodiment, the patterned photoresist layer 112b can be formed on the conductive seed layer 108 in a stable manner via the patterned thermal-sensitive adhesive layer 110a, and therefore the selection of the photoresist material can be more flexible and the adhesion of the photoresist material is less influential. Moreover, the region exposed by the patterned photoresist layer 112b is the region in which a circuit pattern is to be subsequently formed.

Figure 1H:
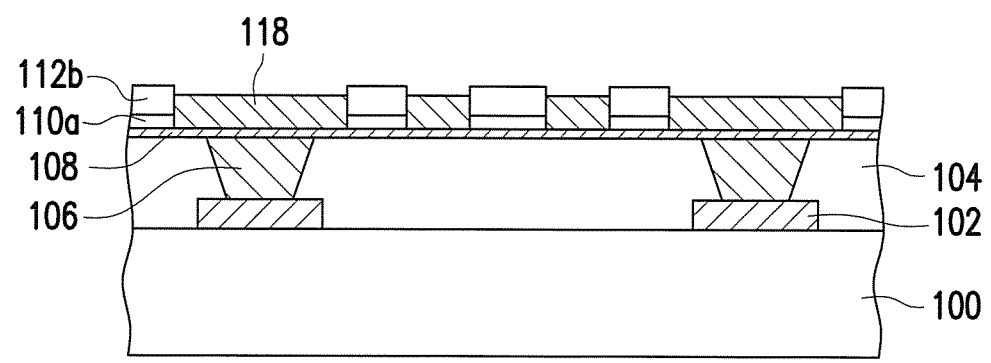

Then, referring to FIG. 1H, a patterned metal layer 118 is formed on the region exposed by the patterned photoresist layer 112b. The material of the patterned metal layer 118 is, for instance, copper. The forming method of the patterned metal layer 118 includes, for instance, performing an electroplating process using the conductive seed layer 108.

Figure 1I:
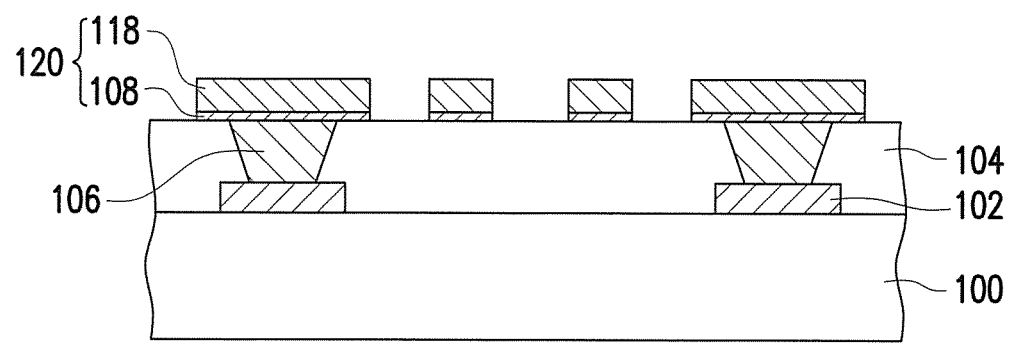

Next, referring to FIG. 1I, the patterned photoresist layer 102b is removed. The method of removing the patterned photoresist layer 112b includes, for instance, performing a wet stripping process. Next, the patterned thermal-sensitive adhesive layer 110a below the patterned photoresist layer 112b is removed. The method of removing the patterned thermal-sensitive adhesive layer 110a includes, for instance, performing UV irradiation, laser irradiation, or infrared heating on the patterned thermal-sensitive adhesive layer 110a to heat the patterned thermal-sensitive adhesive layer 110a to high temperature (such as greater than 100° C.) such that the adhesion thereof is significantly reduced or lost, and then the patterned thermal-sensitive adhesive layer 110a is removed. Alternatively, the patterned thermal-sensitive adhesive layer 110a can also be removed by applying a mechanical force (such as artificial stripping). Next, the conductive seed layer 108 below the patterned thermal-sensitive adhesive layer 110a is removed. The method of removing the conductive seed layer 108 includes, for instance, performing a flash etch process. In this way, the manufacture of the circuit board of the present embodiment is complete. In a circuit board of the present embodiment, the patterned metal layer 118 on the dielectric layer 104 and the conductive seed layer 108 below the patterned metal layer 118 form a circuit pattern 120, and the circuit pattern 120 is connected to the circuit pattern 102 via the conductive via 106.

It should be mentioned that, in the present embodiment, the photoresist material layer 112 is a negative photoresist material layer, but the invention is not limited thereto. In another embodiment, the photoresist material layer 112 can also be a positive photoresist material layer. When the photoresist material layer 112 is a positive resist material layer, after the photoresist material layer 112 is imprinted, an exposure process does not need to be performed (i.e., the step of FIG. 1E is omitted), and the stamp 114 can be directly removed (as shown in FIG. 1F).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a circuit board, comprising:
   providing a dielectric substrate, wherein a circuit pattern, a dielectric layer covering the circuit pattern, and a conductive via located in the dielectric layer and connected to the circuit pattern are disposed on the dielectric substrate;
   forming a thermal-sensitive adhesive layer on the dielectric layer;
   forming a photoresist material layer on the thermal-sensitive adhesive layer;

performing imprinting on the photoresist material layer via a stamp, wherein a first conductive layer is disposed on a surface of a pressing side of the stamp facing the circuit pattern, a second conductive layer is disposed on a surface of other portions of the stamp, and a resistance of the first conductive layer is greater than a resistance of the second conductive layer;

applying a current to the stamp;

removing the stamp and the photoresist material layer and the thermal-sensitive adhesive layer below the pressing side to form a patterned photoresist layer and a patterned thermal-sensitive adhesive layer;

forming a patterned metal layer on a region exposed by the patterned photoresist layer;

removing the patterned photoresist layer;

heating the patterned thermal-sensitive adhesive layer to reduce the adhesion of the patterned thermal-sensitive adhesive layer; and after heating the patterned thermal-sensitive adhesive layer, removing the patterned thermal-sensitive adhesive layer.

2. The manufacturing method of the circuit board of claim 1, wherein the photoresist material layer is a negative photoresist material layer, and after the current is applied to the stamp and before the photoresist material layer and the thermal-sensitive adhesive layer below the pressing side are removed, the method further comprises performing exposure on the photoresist material layer.

3. The manufacturing method of the circuit board of claim 1, wherein the photoresist material layer is a positive photoresist material layer, and after the current is applied to the stamp, the photoresist material and the thermal-sensitive adhesive layer below the pressing side are directly removed.

4. The manufacturing method of the circuit board of claim 1, wherein after the current is applied to the stamp, a temperature of the first conductive layer is higher than 100° C. to reduce an adhesion of the thermal-sensitive adhesive layer below the pressing side.

5. The manufacturing method of the circuit board of claim 1, further comprising, after the conductive via is formed and before the thermal-sensitive adhesive layer is formed, forming a conductive seed layer on the dielectric layer and the conductive via, and further comprising, after the patterned thermal-sensitive adhesive layer is removed, removing the conductive seed layer below the patterned thermal-sensitive adhesive layer.

6. The manufacturing method of the circuit board of claim 1, further comprising, before the patterned thermal-sensitive adhesive layer is removed, performing UV irradiation, laser irradiation, or infrared heating on the patterned thermal-sensitive adhesive layer.

7. The manufacturing method of the circuit board of claim 1, wherein the patterned thermal-sensitive adhesive layer is removed by applying a mechanical force.

8. A stamp for imprinting a photoresist material layer, the stamp comprising:
 a body having a pressing side facing the photoresist material layer;
 a body having a circuit-forming intaglio pattern disposed on a side of the body facing the photoresist material layer, the side with the circuit-forming intaglio pattern of the body being the pressing side for patterning the photoresist material layer;
 a first conductive layer disposed on a portion of an outmost surface of the body on the pressing side; and
 a second conductive layer disposed on another portion of the outmost surface of the body on the pressing side,
 wherein a resistance of the first conductive layer is greater than a resistance of the second conductive layer, and a resistance of the body is greater than a resistance of the first conductive layer.

9. The stamp of claim 8, wherein a material of the body comprises a polymer material.

10. The stamp of claim 8, wherein when a current passes through the first conductive layer and the second conductive layer, a temperature of the first conductive layer is higher than a temperature of the second conductive layer.

11. The stamp of claim 8, wherein the body is an insulating body.

12. The stamp of claim 8, wherein the first conductive layer does not overlap the second conductive layer in a direction parallel to a normal vector of the outmost surface of the body on the pressing side.

13. The stamp of claim 8, wherein the first conductive layer and the second conductive layer form a single layer structure conformally disposed on the pressing side of the body.

* * * * *